United States Patent [19]

Muramatu

[11] Patent Number: 5,639,679

[45] Date of Patent: Jun. 17, 1997

[54] METHOD OF MANUFACTURING A SEMICONDUCTOR DEVICE COMPRISING A NON-VOLATILE MEMORY CELL HAVING A MULTI-LAYERED FLOATING GATE

[75] Inventor: Satoru Muramatu, Tokyo, Japan

[73] Assignee: NEC Corporation, Tokyo, Japan

[21] Appl. No.: 509,631

[22] Filed: Jul. 31, 1995

[30] Foreign Application Priority Data

Jul. 29, 1994 [JP] Japan .................... 6-177873

[51] Int. Cl.$^6$ .............................. H01L 21/8247
[52] U.S. Cl. .................. 437/43; 437/191; 437/926
[58] Field of Search ................... 437/43, 191, 926

[56] References Cited

U.S. PATENT DOCUMENTS

| | | | |
|---|---|---|---|
| 5,147,813 | 9/1992 | Woo | 437/43 |
| 5,441,904 | 8/1995 | Kim et al. | 437/40 |
| 5,559,048 | 9/1996 | Inoue | 437/43 |

FOREIGN PATENT DOCUMENTS 6-29540  2/1994  Japan .

Primary Examiner—John Niebling
Assistant Examiner—Richard A. Booth
Attorney, Agent, or Firm—Young & Thompson

[57] ABSTRACT

Disclosed herein is a method to manufacture semiconductor memory devices that reduces the occurrence of excess deletion failure in a large number of non-volatile memory cells that may be electrically deleted at a time. The invented method also simplifies the manufacture process to improve the production throughput. A thin silicon film 11, a thin silicon oxide film 12, and a thick polycrystalline silicon film 13 that are laminated to comprise a floating gate electrode 4 are continuously formed in a heat treatment furnace having at least two gas inlets so that the film interfaces are not exposed to the atmosphere which usually contains contaminating impurities.

8 Claims, 6 Drawing Sheets

METHOD OF MANUFACTURING A SEMICONDUCTOR DEVICE COMPRISING A NON-VOLATILE MEMORY CELL HAVING A MULTI-LAYERED FLOATING GATE

BACKGROUND OF THE INVENTION

1. Field of the Invention

The present invention relates to a method of manufacturing semiconductor devices, and in particular, to a method of manufacturing a semiconductor device comprising flash-memory type non-volatile semiconductor memory cells having a multi-layered floating gate electrode.

2. Description of the Prior Art

In recent years, much attention has been paid to flash memories that are non-volatile semiconductor devices capable of electrically deleting the entire cell array at the same time. In such a flash memory, a single memory cell is constructed by forming on a P-type silicon substrate, N-type source and drain regions at the respective ends of a gate structure, wherein the gate structure includes a first gate insulating film comprising a silicon oxide film, a floating gate electrode comprising a polycrystalline silicon film, a second gate insulating film comprising a silicon oxide film and a silicon nitride film, and a control gate electrode comprising a polycrystalline silicon film, the films and electrodes being laminated in the named order.

A non-volatile semiconductor memory induces and retains charges in the electrically insulated floating gate electrode as stored information. Information is written by injecting electrons into the floating gate electrode through the first gate insulating film which is a silicon oxide film. Information is deleted by applying a positive voltage to the source region as a deletion voltage and grounding the control gate electrode to produce a tunneling current passing the electrons through the silicon oxide first gate insulating film, thereby discharging the electrons to the source region.

As described above, since the flash memory electrically deletes a large number of non-volatile memory cells at the same time, the voltage required to delete, which hereinafter will be called the deletion voltage, must be constant throughout all the cells.

If, however, the polycrystalline silicon constituting the floating gate electrode in contact with the first gate insulating film has a large grain size, the required deletion voltage varies significantly among the cells because the degree of electric field localization varies depending on the crystallographic directions of the grains. Therefore, among the large number of total cells to be deleted, some cells may be deleted before it is desired. This means that there exists some faulty cells that exhibit an excess deletion type failure.

To eliminate this inconvenience, Japanese Unexamined Patent Application, JP-A-6-29540 discloses a floating gate electrode structure wherein the polycrystalline silicon constituting a floating gate electrode in contact with a first insulating tunnel oxide film has a small grain size. This prior art technique will next be described with reference to FIG. 8.

FIG. 8 is a cross sectional view showing the formation of floating gate electrodes for two adjacent memory cells. First, N-type source and N-type drain regions 44 are formed on a surface element region of a P-type silicon substrate 41. A field oxide film 42 that serves to divide the element region into island-like sections is formed on the N-type source and the N-type drain regions 44, and a silicon oxide film 43 is formed on the surface of the element region between the source region 44 and the drain region 44 as a first gate insulating film.

After forming the silicon oxide film 43, a polycrystalline silicon film 45 is formed on top of the silicon oxide film 43 to have a thickness of about 30 to 50 nm. The obtained structure is then annealed in $N_2$ gas at a relatively low temperature of 700° to 800° C. or left at room temperature for a short period of time to form a silicon oxide film 46 of about 2 to 3 nm in thickness on the surface of the polycrystalline silicon film 45. Then, a thick polycrystalline silicon film 47 having a thickness required as a floating gate electrode is formed on the silicon oxide film 46.

The polycrystalline silicon film 47, silicon oxide film 46, and polycrystalline silicon film 45, all of which are laminated, are patterned to form a floating gate electrode 48. Phosphorous is ion-implanted as an N-type impurity into the polycrystalline silicon film 47 located at the top of the floating gate electrode structure. The structure is then annealed to introduce, through the thin silicon oxide film 46, the phosphorous into the thin polycrystalline silicon film 45 located at the bottom.

A second gate insulating film is subsequently formed on the floating gate electrode 48, and a control gate electrode comprising a polycrystalline silicon film is formed on the second gate insulating film.

In this prior art structure, that part of the floating gate electrode 48 which comes in contact with the tunnel silicon oxide film 43 is comprised of polycrystalline silicon film 45 that is very thin. Thus, the polycrystalline silicon film 45 has a small grain size. Therefore, the variation in the degree of electric field localization dug to the varying crystallographic directions of grains is negligible, and the required deletion voltage is expected to be uniform among different cells.

In the above prior art, however, when the silicon oxide film 46 is formed by annealing in $N_2$ or left at room temperature, the semiconductor wafer is removed from a Chemical Vapor Deposition (CVD) furnace in which the polycrystalline silicon film 45 is formed, and is either transferred to an $N_2$ annealing furnace in which the silicon oxide film 46 is formed or is left exposed to the air atmosphere of the room at room temperature. In either case, the top surface of the thin polycrystalline silicon film 45 is exposed to the atmosphere, i.e., air in the room, etc, containing contaminants such as boron, carbon, metal atoms, or organic substances. These contaminants present in the atmosphere stick to the surface of the thin polycrystalline silicon film 45.

The prior art non-volatile memory manufactured according to FIG. 8 thus has interfacial levels at the interface between the floating gate electrode and the tunnel oxide film or impurity related levels within the tunnel oxide film itself. This results in higher occurrence frequency of excess deletion failure in a non-volatile memory manufactured according to FIG. 8 as compared with a more conventional non-volatile memory with a floating gate electrode comprising only a single layer of polycrystalline silicon film. The occurrence frequencies of excess deletion of the prior art non-volatile memory of FIG. 8 and the conventional single layer floating gate electrode type non-volatile memories are shown as distributions 200 and 100, respectively, in FIG. 9. It can be seen that at times the prior art memories are inferior to the more primitive conventional memories.

The prior art technique may also cause a significant distribution in deletion voltage among memories fabricated using different fabrication apparatuses. These drawbacks tend to result in adverse effects. In addition, with this prior art technique, the yield is unstable, because the mounts of contaminants contained in the atmosphere are not constant even in the clean rooms where these semiconductor devices are manufactured.

Furthermore, if a floating gate electrode of a three-layer structure as is shown in FIG. 8 is to be constructed by forming a polycrystalline silicon film at the bottom using a CVD apparatus, then by forming outside the CVD apparatus, a silicon oxide film sandwiched by top and bottom layers, and then by forming a polycrystalline silicon film located at the top again using the CVD apparatus, the number of manufacturing steps must be increased and the throughput is thus degraded compared with the manufacture of a floating gate electrode comprising a single layer of polycrystalline silicon film. If a surface cleaning step is added to remove contaminants such as boron, carbon, metal atoms, and organic substances stuck to the structure during the formation of the silicon oxide film, the throughput may be further degraded.

OBJECTS OF THE INVENTION

It is thus an object of this invention to provide a manufacturing method of a semiconductor device wherein a floating gate electrode of a laminated structure having a thin polycrystalline silicon film, a thin silicon oxide film, and a thick polycrystalline silicon film is formed in situ in a heat furnace, so as to prevent contaminants in the atmosphere from sticking on the surface of the thin polycrystalline silicon film, thereby reducing the occurrence frequency of the excess deletion failure in a large number of memory cells that may be electrically deleted at one time. It is another object of this invention to simplify the manufacturing process in order to improve production throughput.

SUMMARY OF THE INVENTION

This invention is characterized by a method to manufacture a semiconductor device comprising a non-volatile memory cell having a first gate insulating film, a floating gate electrode, a second gate insulating film and a control gate electrode formed in the named order on a main surface of a semiconductor substrate.

The method comprises the steps of: placing said semiconductor substrate with said first gate insulating film formed thereon into a heat treatment furnace having at least first and second gas inlets; supplying a first gas from said first gas inlet and allowing said first gas to react at a specified temperature and a specified pressure to cause a first silicon film to form on the top surface of said first gate insulating film; stopping the supply of said first gas, thereafter supplying a second gas from said second gas inlet, and allowing said seemed gas to react with the surface of said first silicon film at a specified temperature and a specified pressure to form a first silicon oxide film on the surface of said first silicon film, while retaining said semiconductor substrate in said heat treatment furnace so as to avoid exposure of said first silicon film to the atmosphere outside said furnace; stopping the supply of said second gas, thereafter supplying said first gas from said first gas inlet, and allowing said first gas to react at a specified temperature and a specified pressure to form a second silicon film that is thicker than said first silicon film on the surface of said first silicon Oxide film, while retaining said semiconductor substrate in said heat treatment furnace so as to avoid exposure of said first silicon oxide film to the atmosphere outside said furnace; and subsequently removing said 13 semiconductor substrate from said heat treatment furnace, and patterning said second silicon film, said first silicon oxide film, and said first silicon film to form a floating gate electrode.

The method also comprises the steps of: stopping, after forming said second silicon film, the supply of said first gas, then supplying said second gas from said second gas inlet, and allowing said second gas to react with the surface of said second silicon film at a specified temperature and a specified pressure to form on the surface of said second silicon film a second silicon oxide film, while retaining said semiconductor substrate in said heat treatment furnace so as to avoid exposure of said second silicon oxide film to the atmosphere outside said furnace; and stopping the supply of said second gas, then supplying said first gas from said first gas inlet, and allowing said first gas to react at a specified temperature and a specified pressure to form on the surface of said second silicon oxide film a third silicon film that is thicker than said first silicon film, while retaining said semiconductor substrate in said heat treatment furnace so as to avoid exposure of said second silicon oxide film to the atmosphere outside said furnace, whereby said floating gate electrode obtained after said semiconductor substrate is subsequently removed from the furnace comprises said third silicon film, said second silicon oxide film, said second silicon film, said first silicon oxide film, and said first silicon film.

In the present invention, said first gas is preferably $SiH_4$ or $Si_2H_6$ gas diluted with some inert gas, and said second gas is preferably $O_2$ or $H_2O_2$ gas diluted with some inert gas. Said silicon film that grows in said heat treatment furnace may comprise polycrystalline silicon. Said silicon film that grows in said heat treatment furnace may also comprise amorphous silicon. In this case, the amorphous silicon is polycrystallized during subsequent heat treatment. Furthermore, the temperature and pressure at which said silicon film grows are preferably set to be the same as those at which said silicon oxide film grows. Said semiconductor substrate processed in said heat treatment furnace preferably comprises a semiconductor wafer and said heat treatment furnace is preferably a vertical furnace in which a large number of said semiconductor wafers are each placed horizontally, the wafers stacked with a spacing maintained among them.

As described above, according to this invention, the structure is not removed until a series of steps of first forming a first thin silicon film, then forming a first thin silicon oxide film, and finally forming a second thick silicon film are finished, so contaminants in the atmosphere are prevented from sticking to the top surface of the first thin silicon film located at the bottom. This serves to reduce the occurrence of excess deletion failure in a large number of memory cells and to simplify the manufacturing process to improve the production throughput.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE PREFERRED EMBODIMENTS

The invention will be hereinbelow described with reference to the drawings.

Figure 2A:
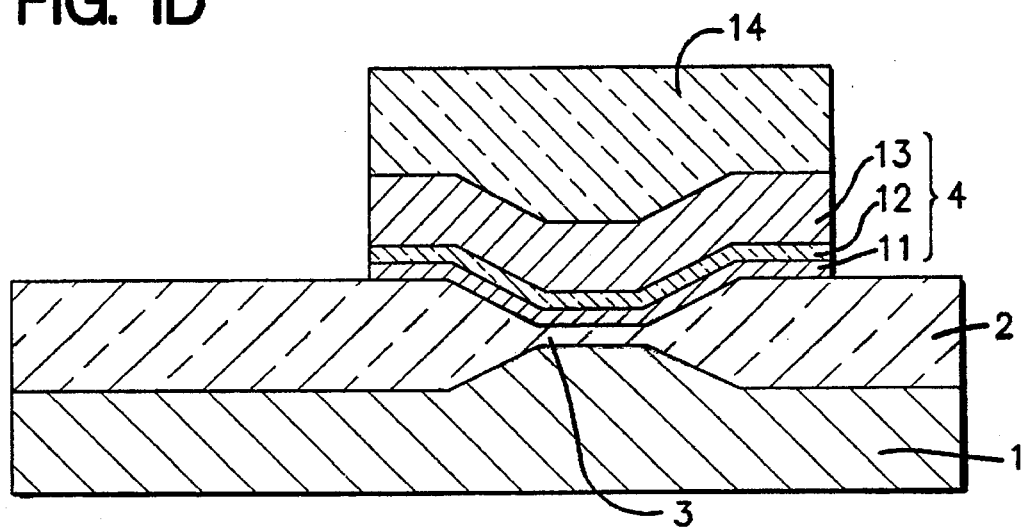
FIG. 2(A),(B) is a cross section sequentially showing the steps following the steps shown in FIG. 1.
Figure 2B:
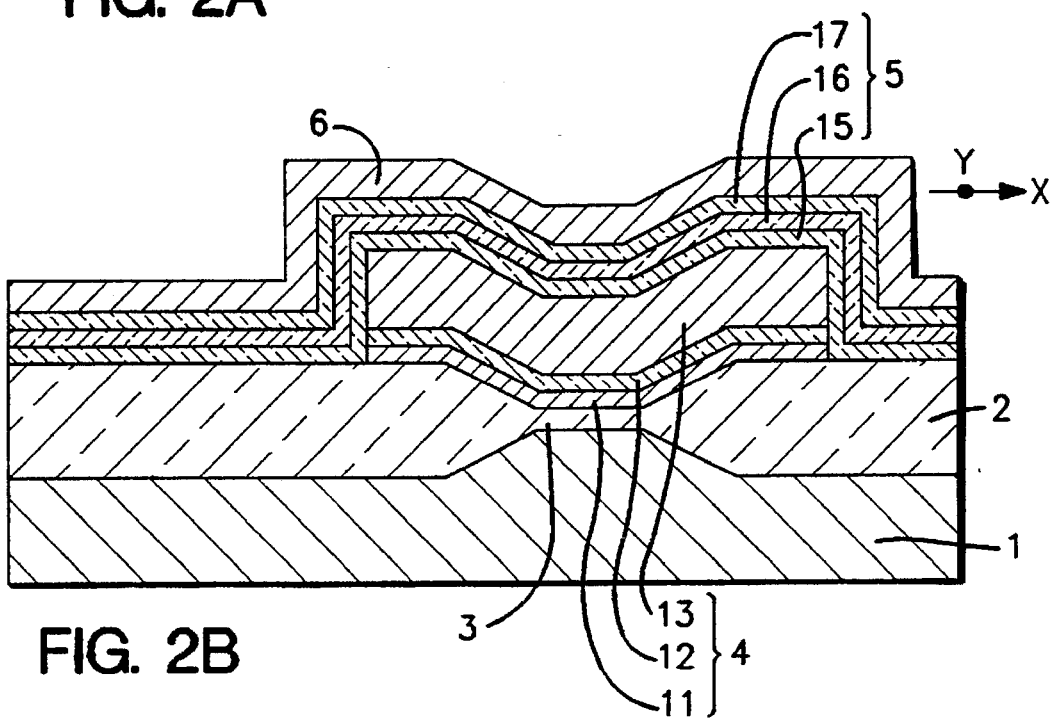
Figure 3:
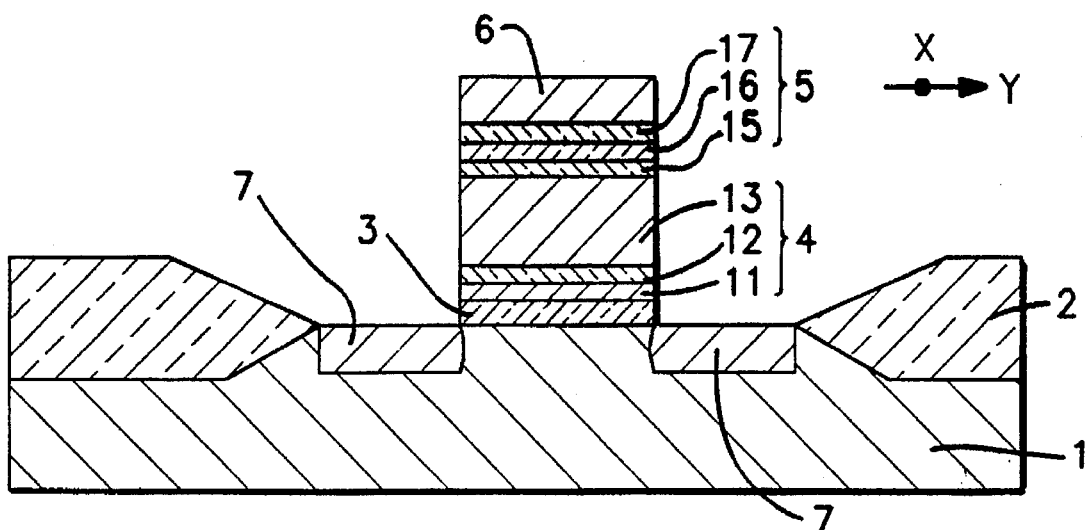
FIG. 3 is a cross section showing the steps following the steps shown in FIG. 2 when viewed from the direction perpendicular to that in FIG. 2.
Figure 4:
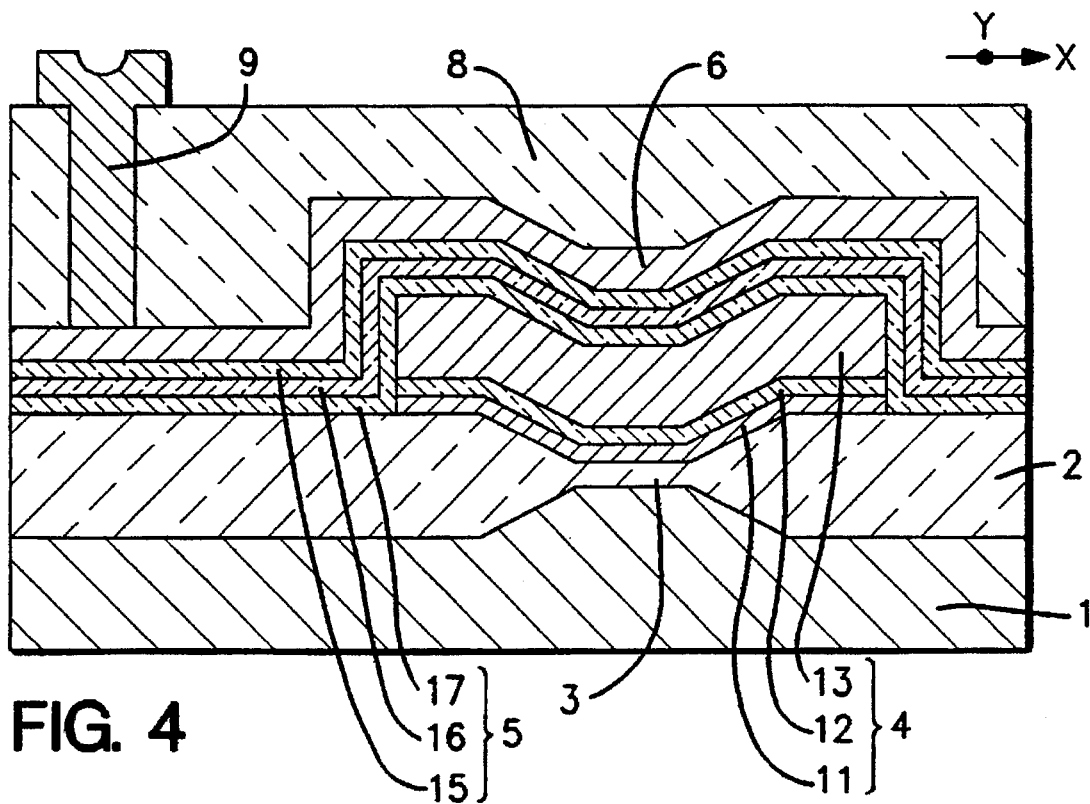
FIG. 4 is a cross section showing the steps following the steps shown in FIG. 3 when viewed from the same direction as in FIGS. 1 and 2.
Figure 5:
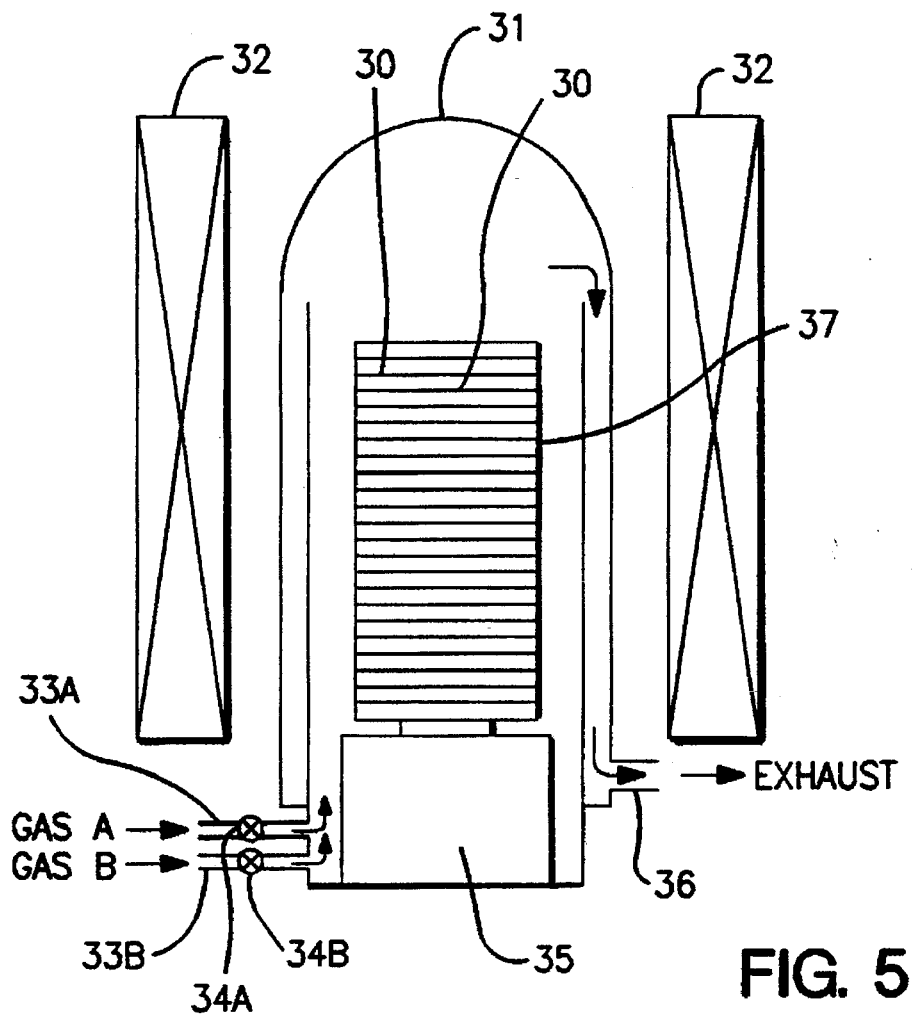
FIG. 5 schematically shows a heat treatment furnace for use in the first embodiment of this invention.
Figure 6:
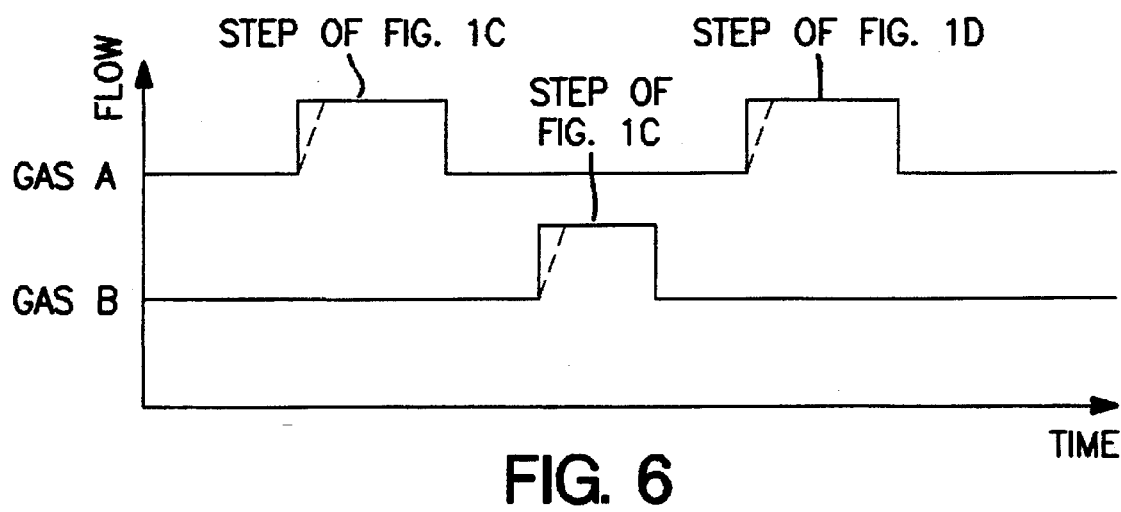
FIG. 6 is a timing chart showing the process executed in the heat treatment furnace according to the first embodiment of this invention.

FIGS. 1 to 4 are cross sections showing a first embodiment of this invention in the order of the relevant manufacturing steps. FIGS. 1, 2, and 4 show the process when viewed from one direction, while FIG. 3 shows the process when viewed from the direction perpendicular to said one direction. FIG. 5 is a schematic drawing showing a heat treatment furnace for use in the embodiment of this invention. FIG. 6 is a timing chart showing the gas flow sequence within the heat treatment furnace in the case of the first embodiment.

Figure 1A:
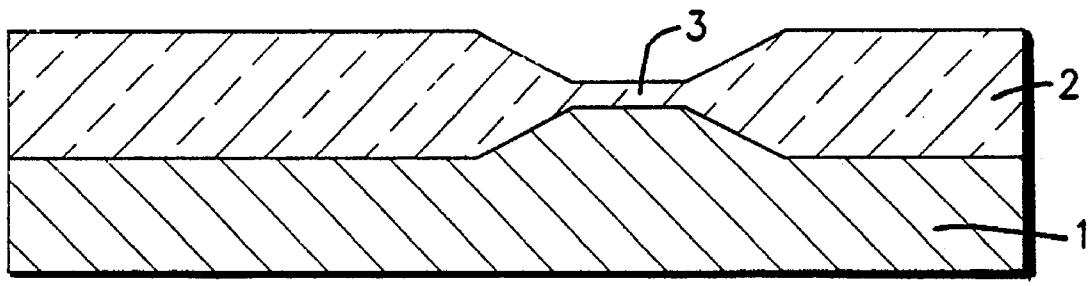
FIG. 1(A)–(D) is a cross section showing the first embodiment of this invention in the order of the relevant manufacturing steps.

As shown in FIG. 1(A), a field insulating film 2 for separating device elements is selectively formed on the major surface of a P-type silicon substrate I to create an element formation region, and a silicon oxide film (a tunnel oxide film) 3 is formed on the element formation region as a first gate insulating film using a thermal oxidation method.

After forming the silicon oxide film 3, the structure is placed into the heat treatment furnace shown in FIG. 5.

In FIG. 5, a furnace tube 31 is surrounded by a heater 32. A large number of semiconductor substrates in the form of wafers are mounted onto a boat 37, which is then placed into the furnace tube 31, wherein the boat 37 is loaded onto a pedestal 35 in the furnace tube 31. First, a semiconductor wafer 30 of the status shown in FIG. 1(A) is placed into the furnace. A first gas inlet 33A for introducing a first gas A into the furnace tube 31 is attached to one side of the lower wall of the furnace tube 31 via a first valve 34A, and a second gas inlet 33B for introducing a second gas B into the furnace tube is also attached to this side via a second valve 34B. A gas outlet 36 for exhausting gas A or B flowing in the direction shown by the arrows is attached to the other side of the lower wall of the furnace tube 31.

Gas A is $SiH_4$ or $Si_2H_6$ gas diluted with inert gas such as He, and causes a polycrystalline or an amorphous silicon film to grow. Gas B is $O_2$ or $H_2O_2$ gas diluted with inert gas such as He, and thermally oxidizes the surface of a silicon film to form a thin silicon oxide film.

Figure 1B:
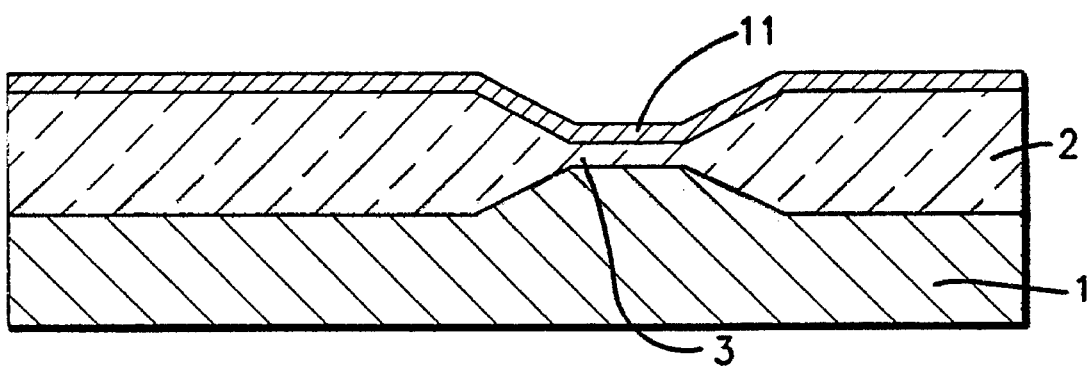

In the process shown in FIG. 1(B) which is executed in fie heat furnace in FIG. 5, the first valve 34A is opened, the second valve 34B is closed, and 500 to 4,000 sccm of gas A is introduced into the furnace to cause a first silicon film 11 or polycrystalline or amorphous silicon to grow at a temperature of 560° to 680° C. and a pressure of 0.3 to 0.8 torr, so as to have a thickness of 2 to 50 nm.

Figure 1C:
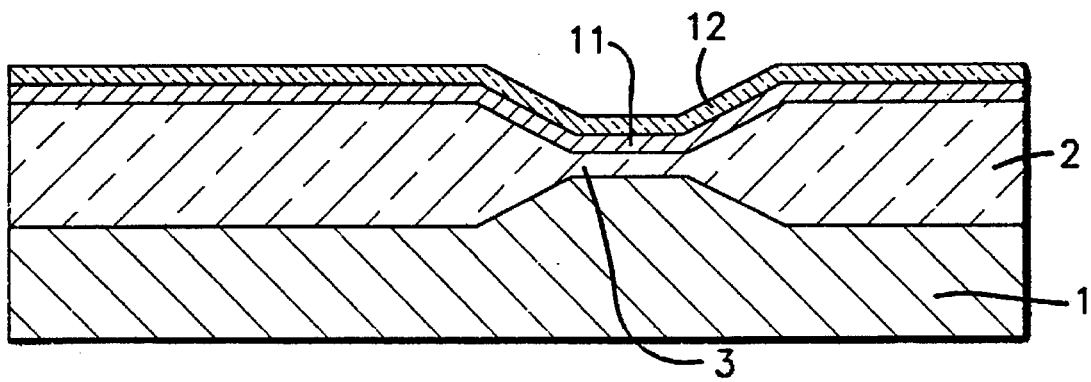

Next, in the process shown in FIG. 1(C), with the semiconductor wafers 30, i.e., the semiconductor substrates retained in the same heat treatment furnace, the first valve 34A is closed, the second valve 34B is opened, and 200 to 2,000 sccm of gas B is introduced into the furnace to thermally oxidize the top surface of the first silicon film 11 at the same conditions as in FIG. 1(B), that is, at a temperature of 550° to 680° C. and a pressure of 0.3 to 0.8 torr to form a silicon oxide film 12 with a thickness of 1 to 3 nm thereon.

Figure 1D:
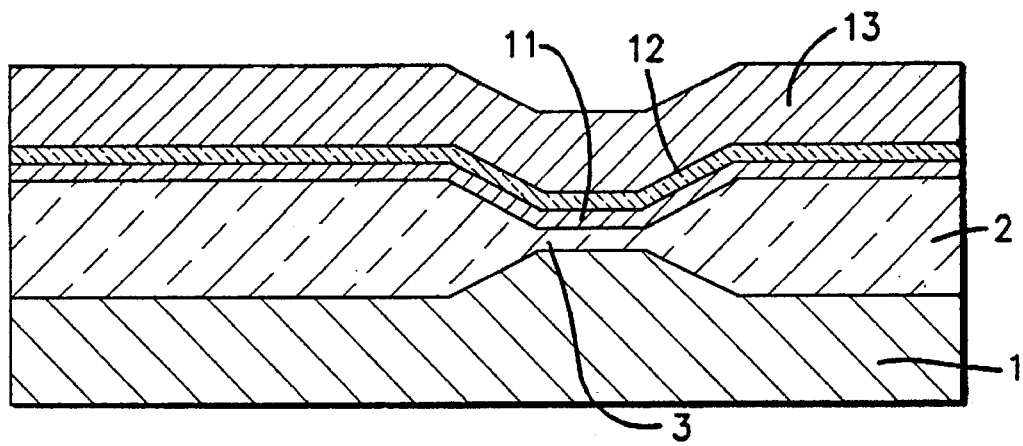

Next, in the process shown in FIG. 1(D), with the semiconductor wafers 30, retained in the same heat treatment furnace, the first valve 34A is opened, the second valve 34B is closed, and 500 to 4,000 sccm of gas A is introduced into the furnace to deposit a second silicon film 13 of polycrystalline or amorphous silicon on the top surface of the silicon oxide film 12 at the same conditions as in FIG. 1(B) and (C), that is, at a temperature of 560° to 680° C. and a pressure of 0.3 to 0.8 torr, so as to have a thickness of 100 to 145 nm that is required as a floating gate electrode.

Since the films 11, 12, and 13 in the processes in FIGS. 1(B) to 1(D) can be formed under the same conditions, that is, at a temperature and a pressure within the above stated ranges, a three-layer structure can be obtained simply by opening and closing the valves.

The gas flow may be increased stepwise as shown by the solid line in the timing chart in FIG. 6 or gradually as shown by the dotted line in the same figure.

Since the first silicon film 11, silicon oxide film 12, and second silicon film 13 are continuously formed in the same heat treatment furnace, the production throughput obtained is approximately equivalent to that obtained by a one-layer structure, and no contaminants stick to the structure because the top surface of the silicon film 11 located at the bottom is not exposed to the atmosphere.

After the process shown in FIG. 1(D), the boat with the semiconductor wafers 30 still mounted thereon is removed from the heat treatment furnace.

In this embodiment, since the first and second silicon films 11, 13 are grown without intentional doping, they are substantially undopeal (for example, the concentration of N- or P-type impurities is $10^{11}$ $cm^{-3}$ or less). Thus, after the structure is removed from the furnace, phosphorous is ion-implanted from over the second silicon film 13 and the structure is annealed to activate and to introduce the phosphorous into the first silicon film 11 through the silicon oxide film 12 that is thinner than the second silicon film 13. This results in both silicon films 11 and 13 becoming N-type. The concentration of phosphorous is not strictly limited, but needs to be lower than the solubility limitations (for example, $10^{20}$ $cm^{-3}$) at subsequent various heat treatment temperatures so as to ensure stable device operation. As an alternative to the ion implantation, the first and second films may be grown inside the heat treatment furnace with intentional doping within the solubility limit with such impurities such phosphorous.

Next, in the process shown in FIG. 2(A), the second silicon film 13, silicon oxide film 12, and first silicon film 11 are sequentially and anisotropically etched to the same pattern using a photoresist 14 as a mask to shape a floating gate electrode 4 in the X direction.

The film thickness of the first silicon film 11 is preferably 50 nm or less to prevent the increase in the grain size of polycrystats in the first silicon film 11 of the floating gate electrode 4 contacting a tunnel silicon oxide film 3 (first gate insulating film), the increase in grain size causing the occurrence of excess deletion failure to increase.

Next, in the process shown in FIG. 2(B), using a CVD method, a silicon oxide film 15 about 7 nm thick, a silicon nitride film 16 about 5 nm thick, and a silicon oxide film 17 about 7 nm thick are deposited in this order over the entire surface of the structure, including the top and side surfaces of the second silicon film 13, side surfaces of the first silicon film 11 and the silicon oxide film 12, thereby forming a second gate insulating film 5. A polycrystalline silicon film 6 about 150 nm thick is formed as a control gate electrode on the silicon oxide film 17.

Next, in the process depicted in FIG. 3 showing a cross section in Y direction perpendicular to that in FIGS. 1 and 2, photolithography and anisotropic etching techniques are used to sequentially etch away the films 6, 17, 16, 15, 13, 12, 11, 3 in order to shape the control gate electrode 6 and floating gate electrode 4 in the Y direction. N-type impurities are then introduced into the silicon substrate to form an N source region 7 and an N drain region 7, in selfalignment with the control gate electrode 6 and the floating gate electrode 4. At this point, N-type impurities are also introduced into the control gate electrode 4, which then becomes an N-type. Photolithography and anisotropic etching techniques, however, may be used to form the shape of the control gate electrode 6 after the impurities are diffused within the polycrystalline silicon film 6 so as to have a concentration of about $6 \times 10^{20}$ cm$^{-3}$.

Next, in the process depicted in FIG. 4 showing a cross section in the X direction as in FIGS. 1(A)–(D) and FIGS. 2(A)(B), an inter-layer insulation film 8 with a thickness of 500 nm is formed on the control gate electrode 6, and a contact hole is formed in the inter-layer insulating film 8 using photolithography and anisotropic etching techniques. A metal wire 9 to be connected to the control gate electrode is formed, and the structure is thermally treated at 950° C. for 60 minutes to reflow the inter-layer insulating film 8. The above process enables the manufacture of a non-volatile memory device having a floating gate electrode and a control gate electrode.

The manufacturing method according to this first embodiment provides a non-volatile memory device with a reduced occurrence of excess deletion failure as well as a small variation in that occurrence frequency among the thus manufactured devices.

Figure 7A:
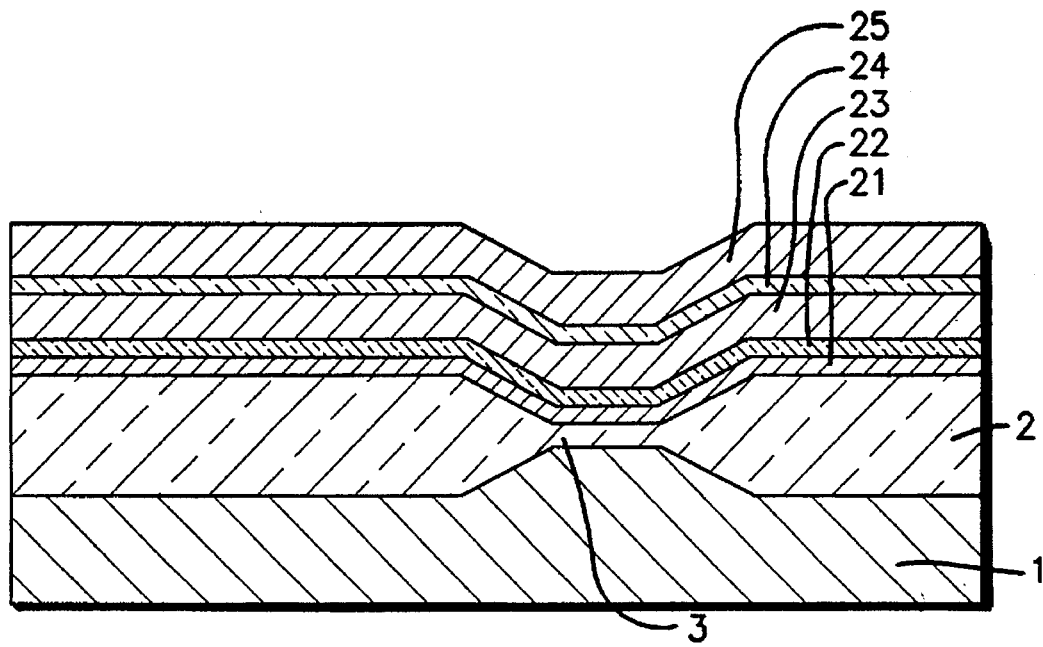
FIGS. 7(A)–(7(B) are a cross section showing part of the process according to a second embodiment of this invention.
Figure 7B:
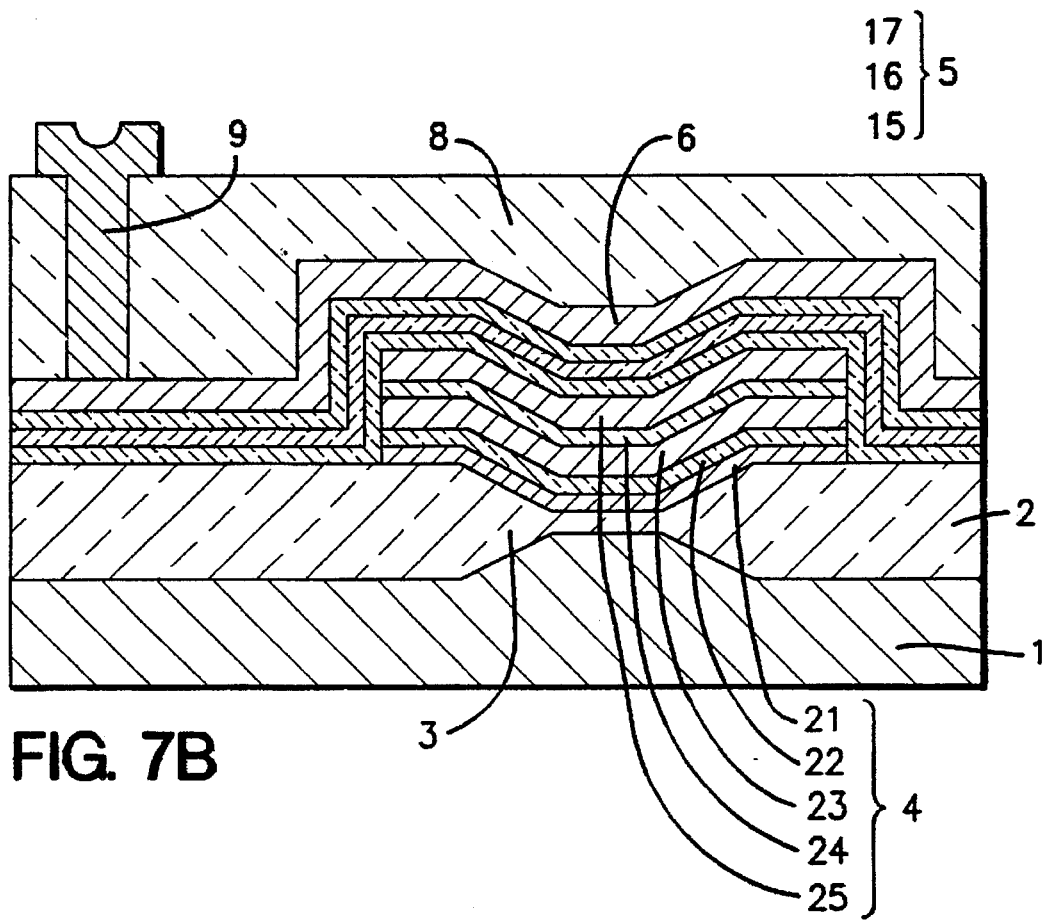
Figure 8:
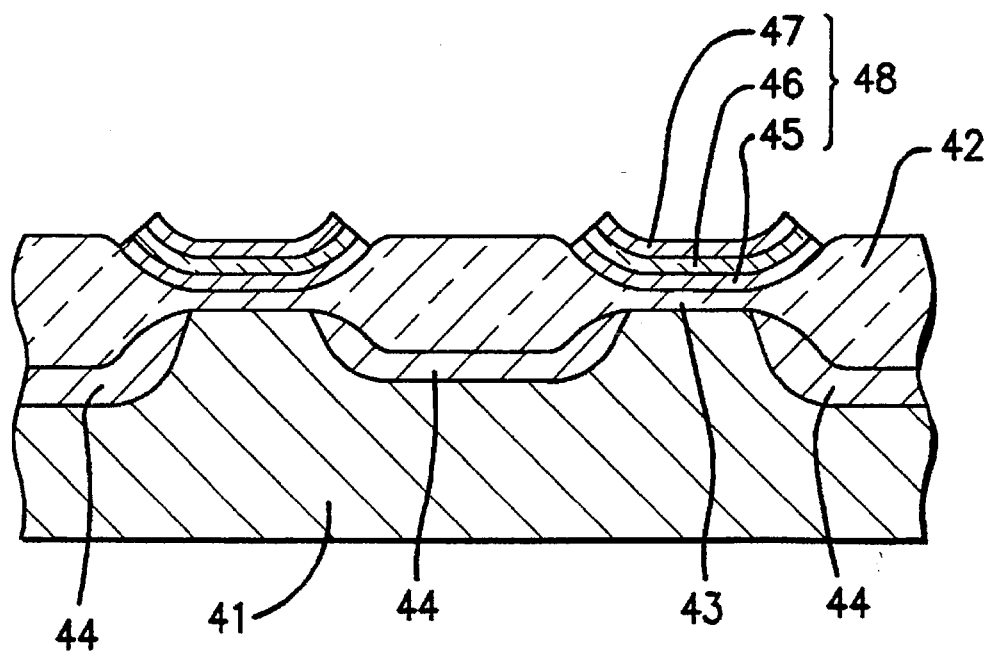
FIG. 8 is a cross section showing the prior art.

FIG. 7 is a cross section showing part of the process according to a second embodiment of this invention; FIGS. 7(A) and 7(B) show the processes corresponding to FIG. 1(D) to FIG. 4. Those components in FIG. 7 which are identical or similar to those in FIGS. 1 to 4 carry the same reference numerals as in these figures, and repetitive description is minimized for brevity.

As in the first embodiment, the process in FIG. 7(A) is executed in the heat treatment furnace of the type shown in FIG. 5 according to the timing chart shown in FIG. 6.

That is, the substrate is placed into the heat treatment furnace, and the first gas A is introduced into the furnace to deposit a first silicon film 21 of polycrystalline or amorphous silicon on the substrate so as to have a thickness of about 2 to 50 nm. After stopping the supply of gas A, the second gas B is again introduced into the furnace to thermally oxidize the first silicon film 21 in order to form thereon a thin silicon oxide film 22 with a thickness of 1 to 3 nm. Next, after stepping the supply of gas B, gas A is again fed into the furnace to deposit a second thick silicon film 23 of polycrystalline or amorphous silicon. Next, after stopping the supply of gas A, gas B is again introduced into the furnace to thermally oxidize the second silicon film 23 in order to form thereon a thin silicon oxide film 24 with a thickness of 1 to 3 nm. Next, after stepping gas B, gas A is again fed into the furnace to deposit a third thick silicon film 25 of polycrystalline or amorphous silicon. The second and third silicon films provide a film thickness required as a floating gate electrode. Since these films 21 to 25 constituting a laminate structure are formed in the same heat treatment furnace without being removed therefrom, the throughput obtained is approximately equivalent to that obtained by a one-layer structure, and no contaminants stick to the structure due to the avoidance of exposure to the atmosphere, as in the first embodiment.

After formation of the film structure as described above, N-type impurities such as phosphorous are diffused into the polycrystalline or amorphous silicon constituting the third silicon film 25 located at the top so as to have a concentration of $2 \times 10^{20}$ cm$^{-3}$. Then, photolithography and anisotropic etching techniques are used to sequentially etch the third silicon film 25, silicon oxide film 24, second silicon film 23, silicon oxide film 22, and first silicon film 21 to a same pattern, thereby forming the floating gate electrode 4 comprising these five films.

For the same reason as in the first embodiment, the first silicon film 21 in this embodiment preferably has a thickness of 50 nm or less.

Thereafter, the same processes as in GIG. 2 to FIG. 4 in the first embodiment are carried out to manufacture a non-volatile memory cell as shown in FIG. 7(B).

Figure 9:
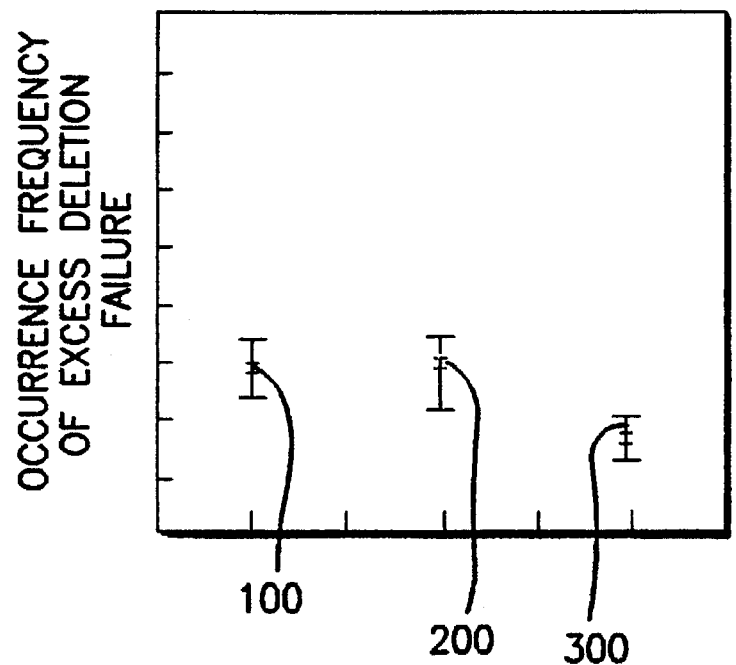
FIG. 9 shows the effects of this invention in terms of excess deletion failure occurrence frequency.

In the second embodiment, when phosphorous is ion-implanted into the third silicon film 25 and the whole structure annealed, the silicon oxide films 24, 22 work as diffusion barriers for the phosphorous, resulting in the concentration of phosphorous in the first silicon film 21 (the tunnel oxide film) being smaller than that in the case of the first embodiment, thus posing no danger of exceeding the solubility limit. Since the second embodiment forms a composite film for a floating gate electrode without removing the structure from the heat treatment furnace, the distribution of the occurrence frequency of excess deletion failure is similar to distribution 300 depicted in FIG. 9.

As described above, in forming a composite film constituting a floating gate electrode, this invention does not remove the structure from the heat treatment furnace until a series of steps of: placing semiconductor wafers into the heat treatment furnace and forming a first silicon film, a first thin silicon oxide film, and a second thick silicon film is finished, so contaminants in the atmosphere do not stick to the top surface of the first thin silicon film located at the bottom. This serves to reduce the occurrence of excess deletion failure in a large number of non-volatile memory cells that may be electrically deleted at a time. It also reduces the difference in the occurrence frequency among devices manufactured and it simplifies the manufacturing process to improve the production throughput.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

I claim:

1. A method of manufacturing a semiconductor device comprising a non-volatile memory cell having a first gate insulating film, a floating gate electrode, a second gate insulating film and a control gate electrode formed sequentially on a main surface of a semiconductor substrate, the method comprising the steps of:

placing said semiconductor substrate with said first gate insulating film formed thereon into a heat treatment furnace having at least first and second gas inlets;

supplying a first gas from said first gas inlet and allowing said first gas to react at a temperature and a pressure to cause a first silicon film to form on the top surface of said first gate insulating film;

stopping the supply of said first gas, thereafter supplying a second gas from said second gas inlet, and allowing said second gas to react with the surface of said first silicon film at a temperature and a pressure to form a first silicon oxide film on the surface of said first silicon film, while retaining said semiconductor substrate in said heat treatment furnace so as to avoid exposure of said first silicon film to an atmosphere outside said furnace;

stopping the supply of said second gas, thereafter supplying said first gas from said first gas inlet, and allowing said first gas to react at a temperature and a pressure to form a second silicon film that is thicker than said first silicon film on the surface of said first silicon oxide film, while retaining said semiconductor substrate in said heat treatment furnace so as to avoid exposure of said first silicon oxide film to the atmosphere outside said furnace; and subsequently removing said semiconductor substrate from said heat treatment furnace, and patterning said second silicon film, said first silicon oxide film, and said first silicon film to form a floating gate electrode.

2. The method of manufacturing a semiconductor device according to claim 1 further comprising the steps of:

stopping, after forming said second silicon film, the supply of said first gas, supplying said second gas from said second gas inlet, and allowing said second gas to react with the surface of said second silicon film at a temperature and a pressure to form a second silicon oxide film on the surface of said second silicon film, while retaining said semiconductor substrate in said heat treatment furnace so as to avoid exposure of said second silicon film to the atmosphere outside said furnace; and stopping the supply of said second gas, thereafter supplying said first gas from said first gas inlet, and allowing said first gas to react at a temperature and a pressure to form a third silicon film that is thicker than said first silicon film on the surface of said second silicon oxide film, while retaining said semiconductor substrate in said heat treatment furnace so as to avoid exposure of said second silicon oxide film to the atmosphere outside said furnace, whereby said floating gate electrode obtained after said semiconductor substrate is subsequently removed from said furnace comprises said third silicon film, said second silicon oxide film, said second silicon film, said first silicon oxide film, and said first silicon film.

3. The method of manufacturing a semiconductor device according to claim 1, wherein said first gas is $SiH_4$ or $Si_2H_6$ gas diluted with an inert gas.

4. The method of manufacturing a semiconductor device according to claim 1, wherein said second gas is $O_2$ or $H_2O_2$ gas diluted with an inert gas.

5. The method of manufacturing a semiconductor device according to claim 2, wherein said first, second and third silicon film formed in said heat treatment furnace comprises polycrystalline silicon.

6. The method of manufacturing a semiconductor device according to claim 2, wherein said first, second and third silicon film formed in said heat treatment furnace comprises amorphous silicon.

7. The method of manufacturing a semiconductor device according to claim 2, wherein the temperature and pressure at which said first, second and third silicon films are formed are set to be the same as those at which said first and second silicon oxide films are formed.

8. The method of manufacturing a semiconductor device according to claim 1, wherein said semiconductor substrate is in the form of a semiconductor wafer, and said heat treatment furnace is a vertical furnace in which a plurality of said semiconductor wafers are each placed horizontally in superposed relation with a spacing maintained therebetween.

* * * * *